United States Patent
Lieberman et al.

(10) Patent No.: US 6,658,895 B2
(45) Date of Patent: Dec. 9, 2003

(54) CARBON NITRIDE COATING FOR OPTICAL MEDIA DISCS

(75) Inventors: Val L. Lieberman, Lancaster, PA (US); J. Hans Richter, Lancaster, PA (US); Yasuo Yamazaki, Lancaster, PA (US)

(73) Assignee: Richter Precision, Inc., East Petersburg, PA (US)

( * ) Notice: Subject to any disclaimer, the term of this patent is extended or adjusted under 35 U.S.C. 154(b) by 0 days.

(21) Appl. No.: 09/931,529

(22) Filed: Aug. 16, 2001

(65) Prior Publication Data

US 2003/0035905 A1 Feb. 20, 2003

(51) Int. Cl.[7] .............................. B32B 9/00
(52) U.S. Cl. .................. 65/374.15; 428/408; 428/698
(58) Field of Search .................. 65/374.15; 428/408, 428/698

(56) References Cited

U.S. PATENT DOCUMENTS

| | | | |
|---|---|---|---|
| 5,026,415 A | * 6/1991 | Yamamoto et al. | |
| 5,112,025 A | 5/1992 | Nakayama et al. | ......... 249/115 |
| 5,192,352 A | * 3/1993 | Kuwabara et al. | |
| 5,380,349 A | * 1/1995 | Taniguchi | |
| 5,474,816 A | 12/1995 | Falabella | ......... 427/580 |
| 5,676,723 A | * 10/1997 | Taniguchi | |
| 5,711,780 A | * 1/1998 | Taniguchi | |
| 5,763,087 A | 6/1998 | Falabella | ......... 428/408 |
| 5,902,369 A | * 5/1999 | Sakamoto | |
| 5,987,922 A | * 11/1999 | Hirota et al. | |
| 6,370,915 B1 | * 4/2002 | Fujimoto et al. | |

FOREIGN PATENT DOCUMENTS

| | | | |
|---|---|---|---|
| JP | 11229147 | * | 8/1999 |
| JP | 2002069635 | * | 3/2002 |

OTHER PUBLICATIONS

D. F. Franceschini et al "Internal stress reduction by nitrogen incorporation . . . " Applied Physics Letters, vol. 60, Issue 26, pp. 3229–3231, Jun. 29,1992.

* cited by examiner

Primary Examiner—Archene Turner
(74) Attorney, Agent, or Firm—Martin Fruitman

(57) ABSTRACT

The disclosure is for a film coating which yields increased life for optical media molds and the method and apparatus for making such a film. The film is a carbon nitride layer of 0.5 to 5.0 microns thickness with 2% to 45% nitrogen coated on an underlayer. One method of making the carbon nitride film is by the use of a pulsed carbon arc to generate a carbon plasma while injecting nitrogen into the vacuum chamber in which the arc is created. Another method is to generate a radio frequency plasma in a vacuum chamber into which acetylene and nitrogen gas are injected. The carbon nitride is formed by the combination of nitrogen with the carbon from the acetylene.

8 Claims, 4 Drawing Sheets

CARBON NITRIDE COATING FOR OPTICAL MEDIA DISCS

BACKGROUND OF THE INVENTION

This invention deals generally with wear and corrosion resistant coatings on metal and more specifically with a coating for plastic injection molds.

Over the last decade, diamond-like carbon coatings deposited on various tools and parts have gained wide acceptance for wear and corrosion protection. The diamond-like carbon coatings demonstrate a unique combination of properties that include high hardness in excess of 2,000 GPa and extremely low coefficients of friction and surface tension. Furthermore, they are chemically inert when in a variety of aggressive environments and have an aesthetically attractive appearance. Such diamond-like carbon coatings are amorphous, which means that they do not have long range repeatability of atomic positions in their crystalline structure.

In recent years diamond-like carbon films have been introduced for coating molds that are used for plastic injection molding where the anti-sticking properties of the diamond-like carbon coatings allow for reduced downtime, longer mold life, and improved product quality. Diamond-like carbon films have been particularly beneficial when used for the protection of the working surfaces of the molds and the mold parts used for manufacturing optical media discs such as CDs, DVDs, and the like. Although discs manufactured with diamond-like carbon film coated molds generally outperform those from uncoated or titanium nitride coated molds, the field performance of diamond-like carbon coated molds varies for different methods of depositing the diamond-like carbon.

Diamond-like carbon coating are generally divided into two broad categories, those containing carbon with less than 1% of other constituents and those containing carbon with greater than 10% of hydrogen. As a rule, diamond-like carbon coatings deposited by sputtering or arcing a carbon target produce hydrogen-free coatings, while films obtained by the plasma assisted breakdown of hydrocarbon gases contain hydrogen. The most common method of depositing diamond-like carbon coatings with hydrogen is by generating a radio frequency with a plasma inside a vacuum chamber where a substrate acts as one electrode and the vacuum chamber body operates as the other electrode. Diamond-like carbon coatings with hydrogen generally have a lower hardness.

One of the drawbacks of diamond-like carbon coatings is the high magnitude of inherent residual stress, which is largely responsible for the problems with film delamination, and the residual stress is generally higher in hydrogen-free diamond-like carbon films. The prior art discloses various underlayers to be used to form a transitional layer that assists in absorbing some of the stress, thus increasing the integrity of the entire coating. The most common underlayer is a layer of titanium or silicon with a thickness of 0.2 to 1.5 microns.

However, even with the underlayer, residual stress leads to a specific failure mode of the diamond-like carbon films used on molds for manufacturing optical discs. In such applications, as the film experiences normal operational wear and the thickness is reduced to 0.3 to 0.5 microns, the coating develops cracks which ultimately break through the entire coating. Since the overall initial thickness of diamond-like carbon coatings rarely exceeds 1.5 microns and typically is in the range of between 1.0 and 1.5 microns, molds can lose up to 50% of their useful life because of premature fracture of the film.

This type of failure can occur in both the signal and the stamper sides of optical media disc molds. Such discs are manufactured by injecting molten resin material into the cavity formed by a signal side mold, a cavity ring, and a stamper supported by a stamper side mold. Failure in the wear resistant film can mean that a mold produces 20% to 50% fewer discs.

It would be very beneficial to have a coating for optical media molds that has a lower wear rate than those presently available and is not subject to premature failure when a significant thickness of the film still remains.

SUMMARY OF THE INVENTION

The present invention uses a film of carbon nitride on mold parts to dramatically increase the useful life of the mold. The film is an amorphous carbon nitride film with a nitrogen content in the range of between 2% and 45% and can be used on molds or mold parts used in optical disc manufacture as a single layer coating or as multiple layers in combination with one or more layers of diamond-like carbon.

In regard to carbon nitride, the compound $\beta$-$C_3N_4$ has been predicted theoretically, but has not actually been produced to date. The amorphous material used in the present invention and produced by the apparatus and methods disclosed is carbon nitride with a mixture of lattices in varying ratios of carbon and nitrogen. Such material is often designated by the symbol $CN_x$.

Operational testing has confirmed that molds with a single layer of carbon nitride or alternate layers of carbon nitride and diamond-like carbon deposited according to the methods of the invention are not as prone to premature failure as molds with diamond-like carbon films alone. The typical wear pattern of the film of the invention is similar to metal-based coatings like TiN, however, the wear rate is dramatically lower. Consequently, the invention yields increased useful life for the molds upon which it is used while maintaining high quality of the products produced by the molds.

The coating of the invention has been produced by both pulsed arc and radio frequency chemical vapor deposition methods which yield carbon nitride coatings with 2% to 45% nitrogen and 0.3 to 5 microns thickness. The apparatus and methods used for producing the coating of the invention are described herein. Pulsed arc deposition of carbon nitride involves the generation of a carbon plasma by the use of a pulsed discharge. In order to generate the carbon plasma, an arc discharge is initiated on the surface of a carbon target. This is similar to the method used with metal targets. However, with metal targets movement of the arc occurs inherently in a random manner With the arc discharge spontaneously extinguishing itself and then re-igniting in a new location, while in the case of a carbon target the spot does not normally extinguish itself or move. Because the amount of material an arc evaporates from any location depends on the time the arc remains in that location, a stationary arc would lead to rapidly burning through the target material followed by catastrophic arcing of the material of the target holder.

In order to prevent destruction of the target material, the pulsed arc method is used to move the arc spot around on the carbon target. The method involves continuously extinguishing and re-igniting the arc by cycling the arc and ignition power supplies on and off, creating a series of pulses at a pulse rate of between 10 and 100 Hz. Under such circumstances each pulse ignites the arc at a different location on the target, thus preventing the catastrophic erosion of the carbon target.

To produce the carbon nitride coating of the invention, a carbon plasma is produced in a vacuum chamber, nitrogen gas is introduced into the vacuum chamber, and a negative voltage in the range of between 100 and 600 volts is applied to the surface to be coated. These conditions form a uniform layer of carbon nitride film with a thickness of 0.5 to 5 microns, and the film has a nitrogen content of 2 to 45%.

An alternate apparatus and method for producing the carbon nitride coating of the invention by radio frequency chemical vapor deposition is similar to the apparatus and method disclosed in U.S. patent application Ser. No. 09/877,451 filed on Jun. 11, 2001 by J. Hans Richter et al and entitled "Diamond-Like Carbon Coating for Optical Media Molds". The disclosure of that concurrent patent application is incorporated herein by reference and made a part of this application.

The prior application describes an apparatus and method of producing a defect free underlayer coating onto an optical media mold, and depositing a diamond-like carbon coating upon the underlayer. The apparatus uses a hollow cathode electron beam generator and a rotating crucible containing the material for the underlayer. The present invention uses the same method and apparatus within a vacuum chamber to produce the underlayer on the mold parts, but after the underlayer coating is completed, a mixture of acetylene and nitrogen is introduced into the vacuum chamber while a radio frequency is used to initiate a plasma. The plasma and particular gas mixture form carbon nitride by breaking down the acetylene and combining the carbon from the acetylene with the nitrogen. Nitrogen content of the coating deposited using the radio frequency method may be varied by either changing the ratio of partial pressure of the reactive gases or by varying the radio frequency power input.

Even when only a stamper side mold producing conventional audio compact discs was coated with the carbon nitride film of the invention by the pulsed arc method of the invention, the coating of the invention improved the yield of the mold before failure by 50% to 500%, an increased yield of several million discs, over the typical previous coating of diamond-like carbon.

The invention thereby provides a dramatic increased lifetime of the molds and thus reduces the cost of manufacturing.

DETAILED DESCRIPTION OF THE INVENTION

Figure 1:
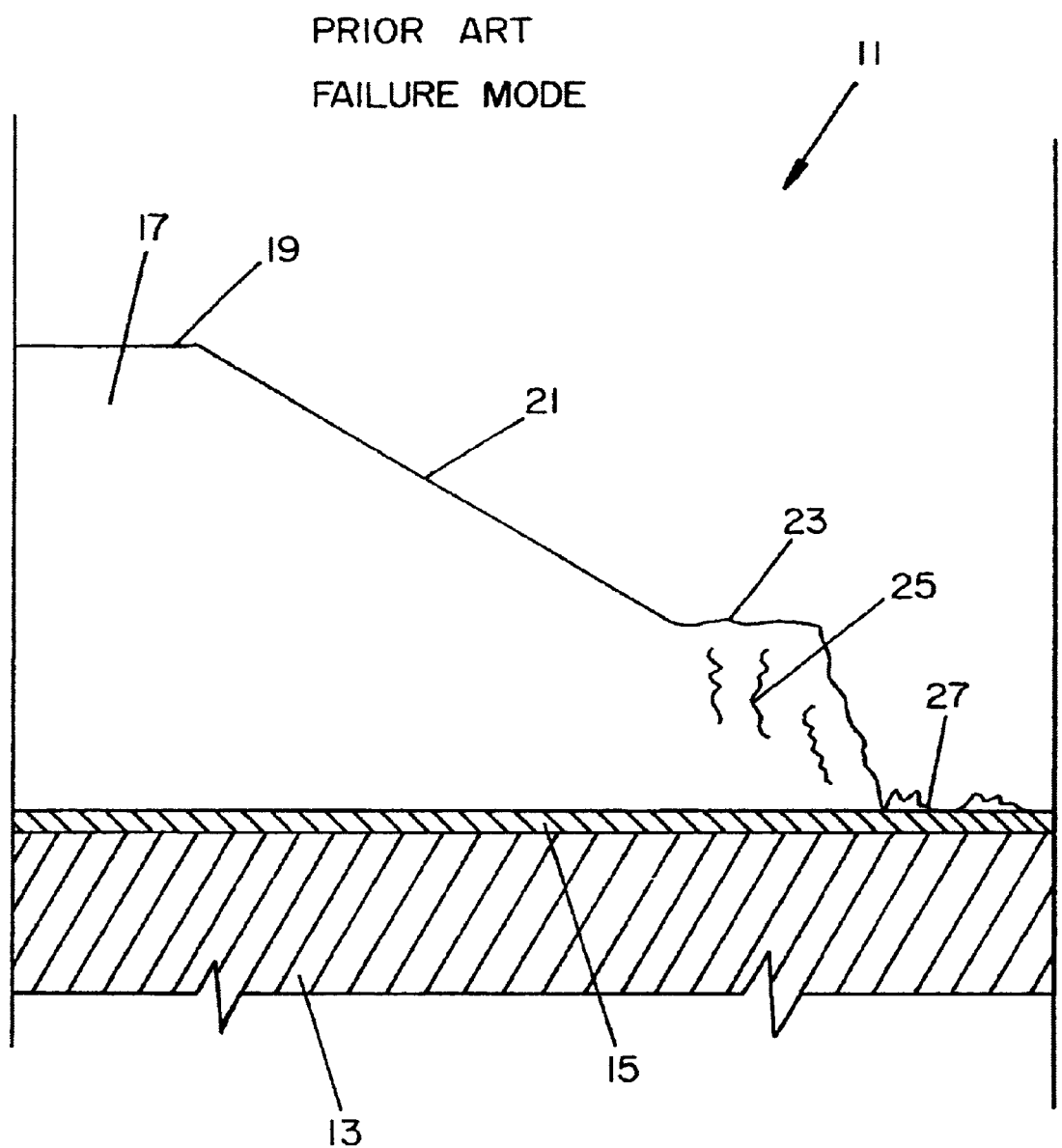
FIG. 1 is a graphical representation of the failure mode of prior art diamond-like carbon coatings on the surfaces of optical media molds in which the surfaces and coatings are shown greatly enlarged and not necessarily in true scale.

FIG. 1 is a graphical representation of the failure mode of prior art diamond-like carbon coatings on the surfaces of optical media molds in which the surfaces and coatings are shown greatly enlarged and not necessarily in true scale. Exposed surface 11 of the mold is actually composed of three different layers. Optical media mold 13, of course, is the base structure upon which underlayer 15 and diamond-like carbon film 17 are coated. The thickest area 19 of diamond-like carbon film 17 is shown as it is originally deposited, and is a layer which is approximately 1 micron thick. Area 21 depicts the gradual reduction in this thickness as film 17 is worn down during operation. Area 23 represents the thickness of 0.3 to 0.5 microns at which coating 17 begins to develop cracks 25. Cracks 25 eventually cause complete failure of coating 17 as pieces break off to expose underlayer 15. This failure mode is dramatically delayed by the carbon nitride coating of the present invention.

Figure 2:
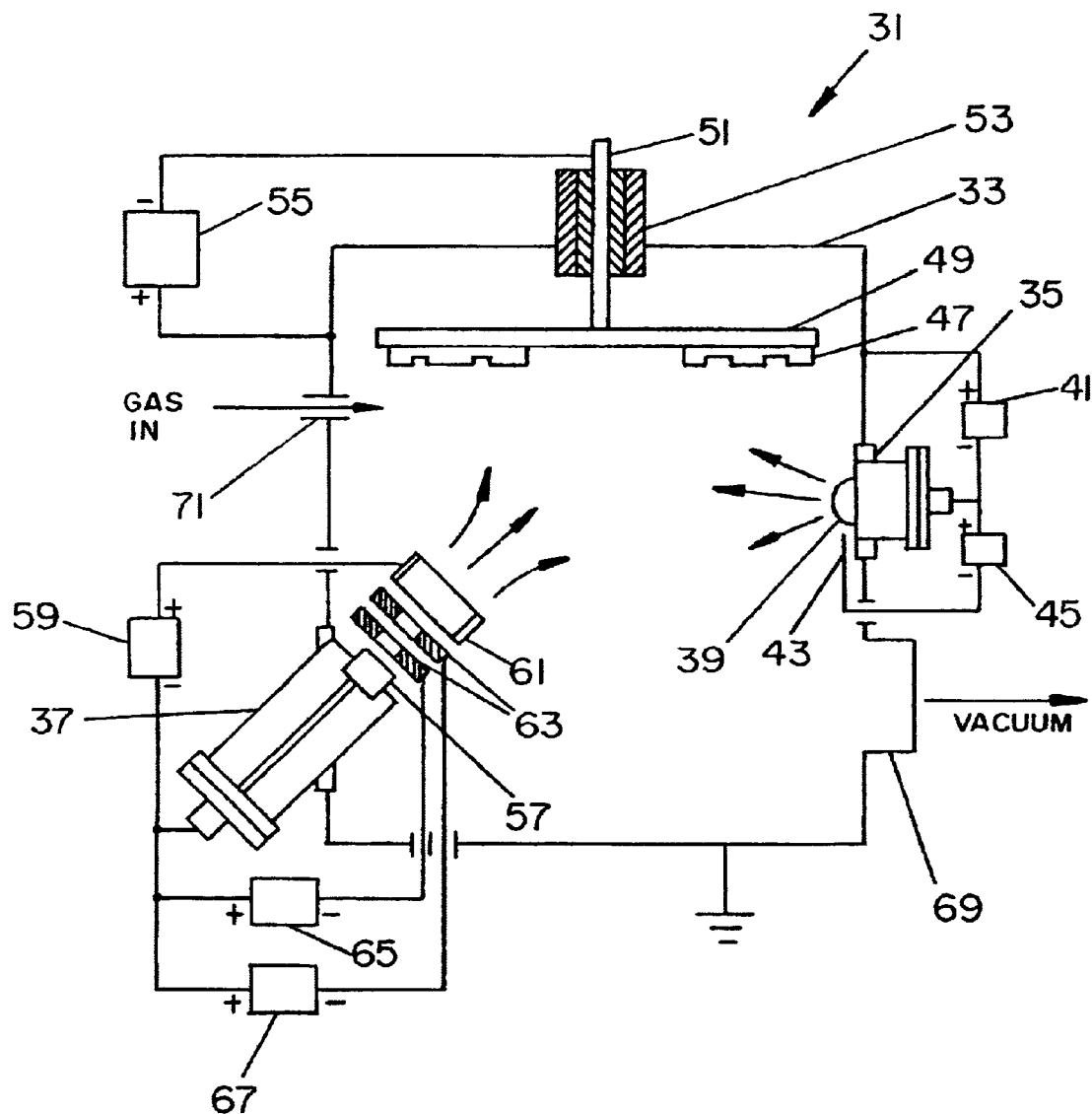
FIG. 2 is a schematic diagram of the pulsed arc apparatus for depositing the coating of the invention.

FIG. 2 is a schematic diagram of the pulsed arc apparatus 31 for depositing the coating of the invention, in which vacuum chamber 33 contains cathodic arc source 35 to produce the underlayer and carbon source 37 to aid in production of the carbon nitride film.

Cathodic arc source 35 includes target 39 that is made of the material which will serve as the underlayer. Target 39 is connected to DC power supply 41 that provides the current for the vacuum arc which strikes the surface of target 39 to evaporate the target material. Igniter 43, operating in conjunction with power supply 45, initiates the arc discharge on target 39. Substrates 47 to be coated, which are typically optical media molds or parts of such molds, are attached to substrate holder 49 by conventional devices which may include mechanical clamping or direct mounting with a screw. Substrate holder 49 can be rotated by its shaft 51 which penetrates through vacuum feedthrough 53 and is attached to a motor (not shown). The rotation of substrate holder 49 assures uniform coverage of substrates 47 during deposition of the underlayer and carbon nitride coatings. Substrate holder 49 is electrically isolated from vacuum chamber 33 and connected to the negative terminal of bias power supply 55. With the negative terminal of bias power supply 55 connected to vacuum chamber 33 which is grounded, both the underlayer material from target 39 and the carbon nitride produced within vacuum chamber 33 are attracted to and deposit upon substrate 47.

Deposition of carbon nitride is initiated by the production of a carbon plasma by carbon source 37. The preferred embodiment of the invention uses a pulsed arc system for generating the carbon plasma. To generate the carbon plasma, an arc discharge is initiated on the surface of carbon target 57 that is typically made of graphite. Target 57 is connected to the negative terminal of power supply 59 which provides the current for the carbon arc discharge. The positive terminal of power supply 59 is connected to anode ring 61. Igniter rings 61 serve to ionize the gap between target 57, acting as a cathode, and anode ring 61, and igniter rings 61 are independently powered by power supplies 65 and 67.

In operation, substrates 47 are mounted on substrate holder 49, vacuum chamber 33 is pumped down to a vacuum of $1 \times 10^{-5}$ Torr through vacuum port 69 by a vacuum pump (not shown), and the outgassing rate is checked to assure the vacuum integrity of the apparatus and completion of the outgassing from the components and interior surfaces of vacuum chamber 33.

When the vacuum is satisfactory, the underlayer is deposited on substrates 47 by starting arc source 35, injecting argon gas through gas port 71, and applying negative bias voltage to substrate holder 49 from power supply 55. Titanium is used as the underlayer material in the preferred embodiment.

After the underlayer is deposited, deposition of the carbon nitride is initiated by starting carbon source 37. Power supplies 59, 65, and 67 are controlled to apply repetitive momentary bursts of power to the surface of carbon target 57 to create arc discharges. Igniter rings 63 ionize the gap between target 57 and anode 61 by having their power supplies 65 and 67 electronically controlled to generate the ignition discharge just milliseconds before the main pulse is generated between target 57 and anode 61 by power supply 59.

The discharge at target 57 evaporates graphite and creates a carbon plasma which includes ions, neutral atoms, and mixtures of atoms. The discharge lasts between 50 and 500 milliseconds, with a preferred time of 50 milliseconds and the discharge and pause times being equal. At the same time nitrogen gas is introduced through gas inlet 71 to form carbon nitride, and a negative voltage of 100 to 600 volts, with a preferred voltage of 400 volts, is applied to substrate holder 49. These conditions deposit a uniform layer of carbon nitride film with a thickness of 0.5 to 5 microns with a nitrogen content of 2 to 45%.

The preferred thickness of the coating for plastic injection molds for optical media discs is 1.5±0.3 microns. Coatings that are greater than 5 microns have a tendency to delaminate due to aggregated intrinsic stress, and coatings which are less than 0.5 microns do not provide the maximum benefit of the coating. The desired thickness of the coating is achieved by controlling the deposition time. The deposition time for the preferred coating thickness has been determined experimentally and is typically one hour.

The preferred nitrogen content in the coating is about 7 atomic percent, which is achieved at a partial pressure of nitrogen of approximately 0.1 Pa. The hardness of the coating decreases and the coefficient of friction increases as the nitrogen content increases, and when the nitrogen is less than 2% or greater than 45% the performance characteristics of the coating make it undesirable.

Nitrogen content in the coating is controlled by the partial pressure of nitrogen gas in the chamber during deposition with the preferred partial pressure of 0.1 Pa yielding 6 to 8 atomic percent nitrogen in the coating. The amount of nitrogen can also be controlled by changing the frequency of the pulses in the pulsed arc deposition process described above. For example, increasing the pulse frequency from 20 Hz to 60 Hz results in lowering the nitrogen content from 6–7 to 34 atomic percent.

Figure 3:
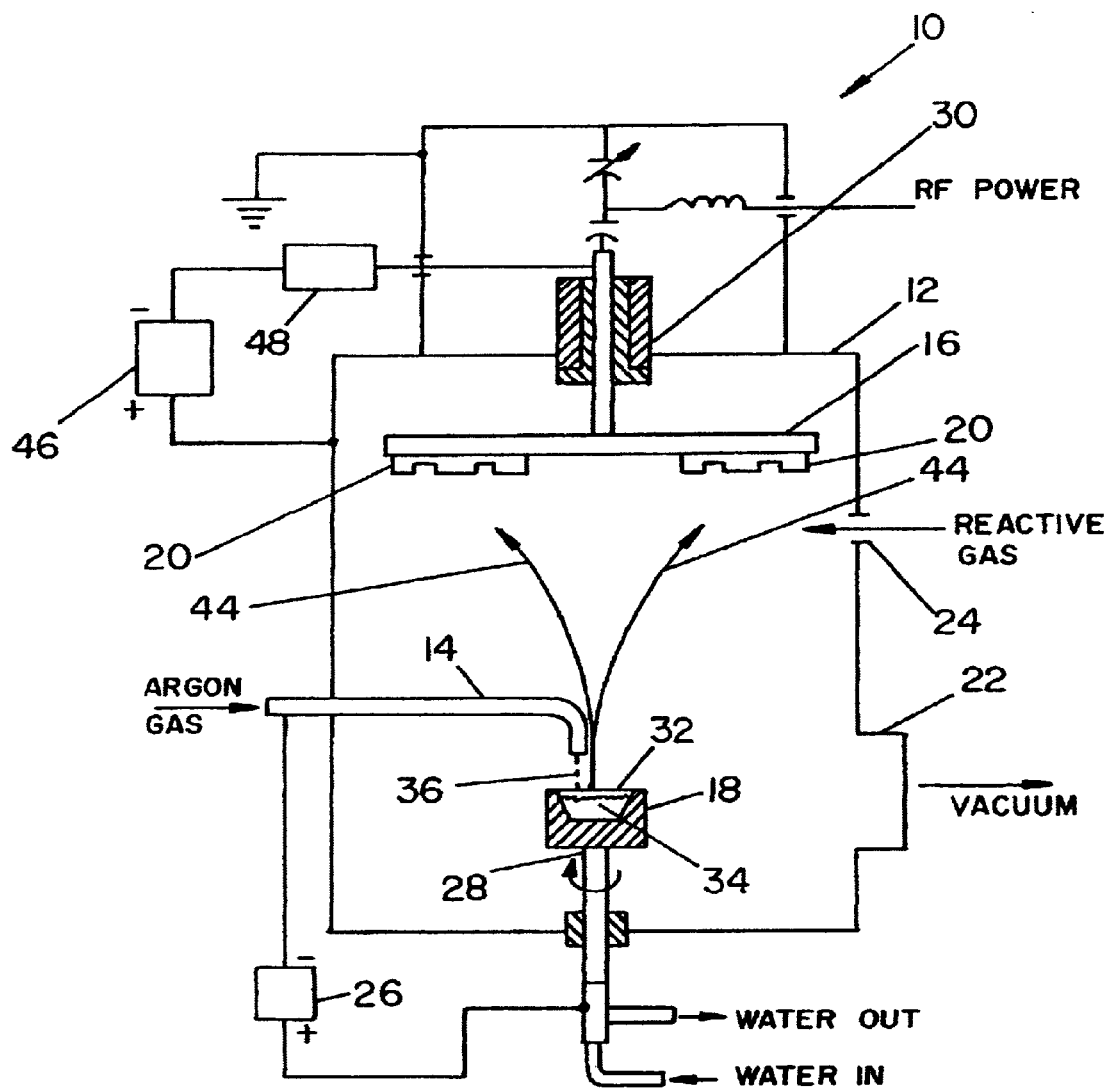
FIG. 3 is a schematic diagram of the radio frequency chemical vapor deposition apparatus for depositing the coating of the invention.

FIG. 3 is a schematic diagram of an alternate embodiment of a radio frequency chemical vapor deposition apparatus 10 of the invention in which vacuum chamber 12 contains hollow cathode 14, substrate holder 16, and crucible 18. Substrates 20 are held onto substrate holder 16 by conventional means such as mechanical clamping as substrate holder 16 is rotated. Radio frequency power is applied to substrate holder 16 by conventional means (not shown) through feedthrough 30. The radio frequency is used to produce the carbon nitride layer after the underlayer is coated onto the substrates by hollow cathode 14.

To produce the coatings, vacuum chamber 12 is maintained at a suitable level of vacuum in the range of $1 \times 10^{-2}$ to $1 \times 10^{-5}$ Torr by a vacuum system (not shown) which is connected to vacuum port 22. Reactive gases acetylene and nitrogen are fed into vacuum chamber 12 at pipe 24.

Inert gas argon is supplied to vacuum chamber 12 through hollow cathode 14. Hollow cathode 14 is maintained at a negative voltage of 20 to 100 volts relative to rotating crucible 18 by power supply 26, and substrate holder 16 is maintained at a negative voltage relative to vacuum chamber 12 by power supply 46 which is connected to substrate holder 16 through radio frequency filter 48. The DC voltage applied to substrate holder 16 is used for increasing the density of the underlayer and is not required for all applications.

Rotating crucible 18 is rotated by shaft 28 that passes through vacuum chamber wall 30. Crucible 18 has a central cavity 32 which contains coating material 34. The preferred coating material 34 for use as an underlayer for a carbon nitride film is titanium, which is placed in cavity 32 in the form of pellets and melted by the power supplied from electron beam 36 which is generated between hollow cathode 14 and crucible 18.

Crucible 18 itself is water cooled by using shaft 28 to transport water to and from the crucible. Water is furnished to and removed from hollow shaft 28 by a conventional rotating coupling (not shown).

As in all such hollow cathode systems, electron beam 36 melts the coating material in crucible 18, forms liquid metal pool 34, and metal vapor is therefore generated. Vapor 44 is also ionized by the electron beam as an inert gas, argon, is fed into the hollow cathode to maintain the ionization. The ions and neutral atoms migrate to substrates 20, and when the ions and neutral atoms contact the substrates they form the desired coating. The ions and neutral atoms are actually deposited upon the substrates because the substrates are at a lower temperature than the liquid metal pool so that the metal vapor essentially condenses on the substrates.

After the underlayer is deposited, a film of carbon nitride is formed on top of the underlayer. To do this, power supply 46 is turned off and the argon gas is pumped out of vacuum chamber 12. A mixture of nitrogen and acetylene is then injected into vacuum chamber 12 at port 24 in a manner which maintains the ratio of nitrogen to acetylene in the range of between 0.1 and 1.5, and preferably at 1.0, while the radio frequency power is applied to substrates 20. This procedure forms the carbon nitride coating on top of the underlayer that is on substrates 20 by breaking down the acetylene and combining the carbon with the nitrogen. The resulting preferred carbon nitride film for optical media molds is 1.5±0.3 microns thick with a maximum range of 0.5 to 4 microns.

Several tests have been performed on test pieces with deposited carbon nitride films. Test pieces were tested for premature delamination using the ball crater test, and real time coefficient of friction measurements were made during pin-on disc wear tests.

For the ball crater test, a rotating carbide ball wetted with a diamond slurry is used to grind through the coating and into the substrate, thus forming a crater that can be inspected under a microscope. Since the ball essentially wears the coating down while applying a constant load, it represents a valid model for determining the coatings susceptibility to fracture prior to wear to the point of zero thickness. Metallurgical inspection of the crater allows determination of whether the coating has worn out or fractured and delaminated.

The results of such tests have indicated that delamination occurs for 2 micron and 2.3 micron samples of diamond-like carbon produced by the pulsed arc method from pure carbon, but not for a 2.1 micron layer of carbon nitride; a three layer configuration of 1 micron layers of carbon nitride, diamond-like carbon, and carbon nitride produced by the pulsed arc method; or 2.2 and 3.1 micron layers of carbon nitride produced by the radio frequency chemical vapor deposition method.

Figure 4:
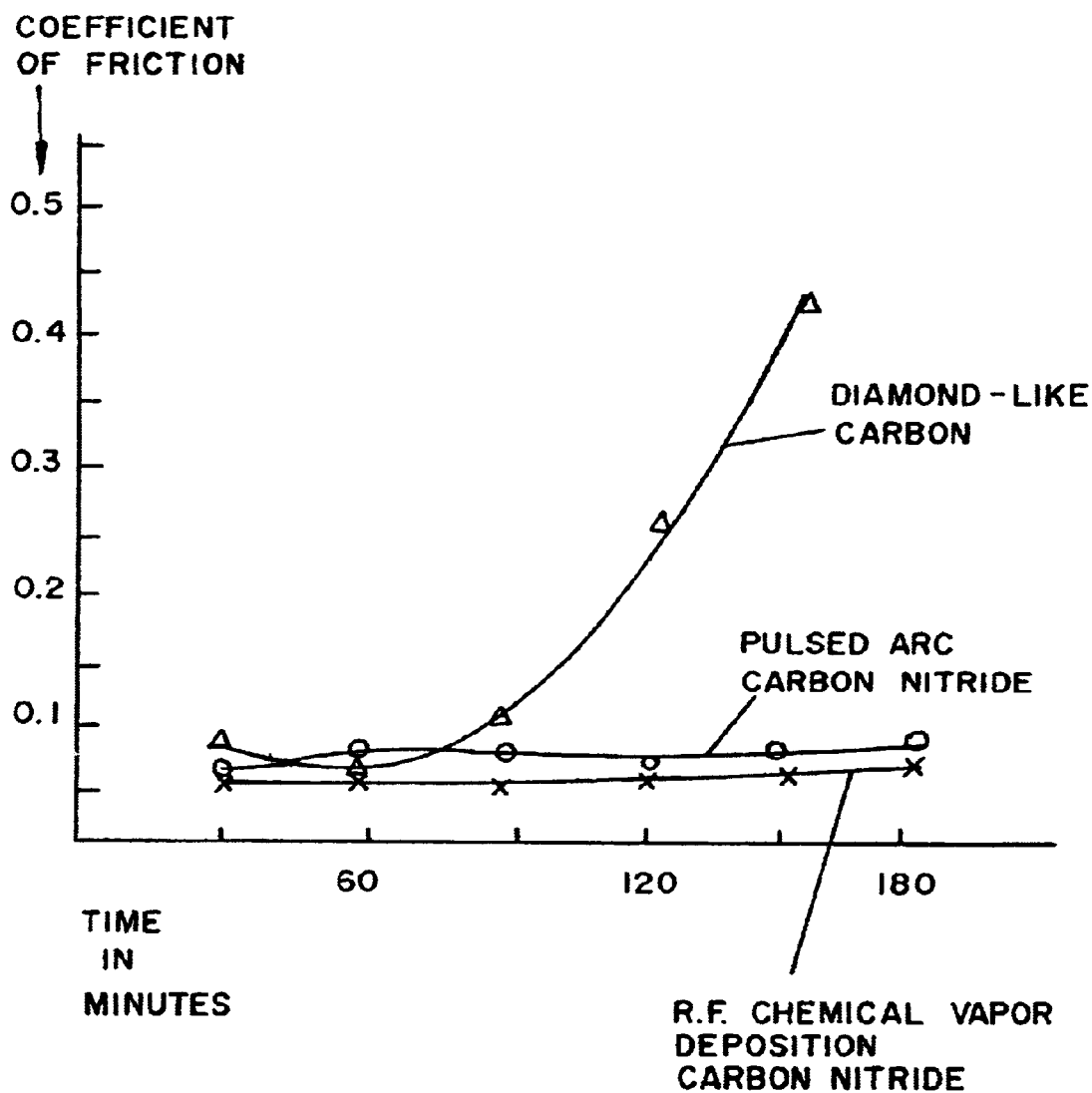
FIG. 4 is a graph comparing the coefficient of friction vs. time curves of the carbon nitride coating of the invention against a diamond-like carbon coating.

FIG. 4 is a graph comparing the coefficient of friction vs. time curves of the carbon nitride coating of the invention against a diamond-like carbon coating. The test points shown are the results of pin-on-disc tests under reciprocating motion in marginally lubricated conditions when the coefficient of friction is measured in real time. The graph of FIG. 4 clearly shows the positive results for carbon nitride film. The coefficient of friction of diamond-like carbon film rises sharply after about 90 minutes of testing, while the carbon nitride films deposited either by pulsed arc or the radio frequency chemical vapor deposition methods demonstrate a stable value of the coefficient of friction during the entire 180 minutes of the test period.

These tests demonstrate the beneficial effects which are attained when the carbon nitride film of the invention is deposited on optical mold surfaces instead of diamond-like carbon.

It is to be understood that the form of this invention as shown is merely a preferred embodiment. Various changes may be made in the function and arrangement of parts: equivalent means may be substituted for those illustrated and described; and certain features may be used independently from others without departing from the spirit and scope of the invention as defined in the following claims.

What is claimed as new and for which Letters Patent of the United States are desired to be secured is:

1. A coating on an optical media mold comprising an underlayer and a carbon nitride film formed on top of the underlayer.

2. A coating on an optical media mold comprising an underlayer produced by the use of an electron beam generated between a cathode and a crucible, and a carbon nitride film formed on top of the underlayer.

3. A coating on an optical media mold comprising an underlayer and a carbon nitride film formed on top of the underlayer by the use of a pulsed arc discharge to combine carbon from a carbon arc with nitrogen.

4. A coating on an optical media mold comprising an underlayer and a carbon nitride film formed on top of the underlayer by producing a radio frequency plasma to combine carbon from acetylene gas with nitrogen gas.

5. A coating on an optical media mold comprising at least one layer of diamond-like carbon and at least one layer of carbon nitride film.

6. A coating on an optical media mold comprising an underlayer, at least one layer of diamond-like carbon, and at least one layer of carbon nitride film.

7. A coating on an optical media mold comprising a layer of carbon nitride with a thickness in the range of between greater than 1.6 and 5 microns.

8. A coating on an optical media mold comprising a layer of carbon nitride with the nitrogen content in the range of between 2 and 45 atomic percent.

* * * * *